(12) United States Patent
Kawai

(10) Patent No.: US 9,222,186 B2
(45) Date of Patent: Dec. 29, 2015

(54) METHOD FOR MANUFACTURING PRINTED WIRING BOARD

(71) Applicant: IBIDEN CO., LTD., Ogaki-shi (JP)

(72) Inventor: Satoru Kawai, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/555,909

(22) Filed: Nov. 28, 2014

(65) Prior Publication Data

US 2015/0156888 A1 Jun. 4, 2015

(30) Foreign Application Priority Data

Nov. 29, 2013 (JP) .................................. 2013-248317

(51) Int. Cl.
| | | |
|---|---|---|
| *H01L 23/495* | (2006.01) | |
| *C25D 5/18* | (2006.01) | |
| *C25D 7/00* | (2006.01) | |
| *C25D 5/02* | (2006.01) | |
| *H05K 3/42* | (2006.01) | |
| *H01L 21/288* | (2006.01) | |
| *C25D 3/38* | (2006.01) | |
| *C23C 18/16* | (2006.01) | |

(52) U.S. Cl.
CPC .. *C25D 5/18* (2013.01); *C25D 5/02* (2013.01); *C25D 7/00* (2013.01); *H05K 3/423* (2013.01); *C23C 18/1653* (2013.01); *C25D 3/38* (2013.01); *H01L 21/2885* (2013.01); *H05K 3/427* (2013.01); *H05K 2201/09827* (2013.01); *H05K 2203/1492* (2013.01); *H05K 2203/1572* (2013.01)

(58) Field of Classification Search
CPC ...................... H01L 21/76877; H01L 21/2885
USPC .................................................. 438/667–687
See application file for complete search history.

(56) References Cited

U.S. PATENT DOCUMENTS

| | | | |
|---|---|---|---|
| 7,582,199 B2 * | 9/2009 | Knop et al. .................... | 438/686 |
| 2009/0236230 A1 * | 9/2009 | Reents et al. .................. | 205/103 |

FOREIGN PATENT DOCUMENTS

| | | |
|---|---|---|
| JP | 2007-227512 A | 9/2007 |
| JP | 2008-513985 A | 5/2008 |
| WO | WO 2006/032346 | 3/2006 |

* cited by examiner

*Primary Examiner* — Cuong Q Nguyen

(74) *Attorney, Agent, or Firm* — Oblon, McClelland, Maier & Neustadt, L.L.P.

(57) ABSTRACT

A method for manufacturing a printed wiring board includes forming a through hole in an insulating substrate such that the hole extends from first surface of the substrate to second surface of the substrate on the opposite side, forming a seed layer on the first and second surfaces and wall of the hole, and applying pulse plating to the substrate via the seed layer such that a through-hole conductor is formed in the hole. The applying of the pulse plating includes flowing forward and reverse current on the first and second surfaces of the substrate such that when the forward current flows on the first surface of the substrate, the reverse current flows on the second surface of the substrate and that when the reverse current flows on the first surface of the substrate, the forward current flows on the second surface of the substrate.

20 Claims, 15 Drawing Sheets

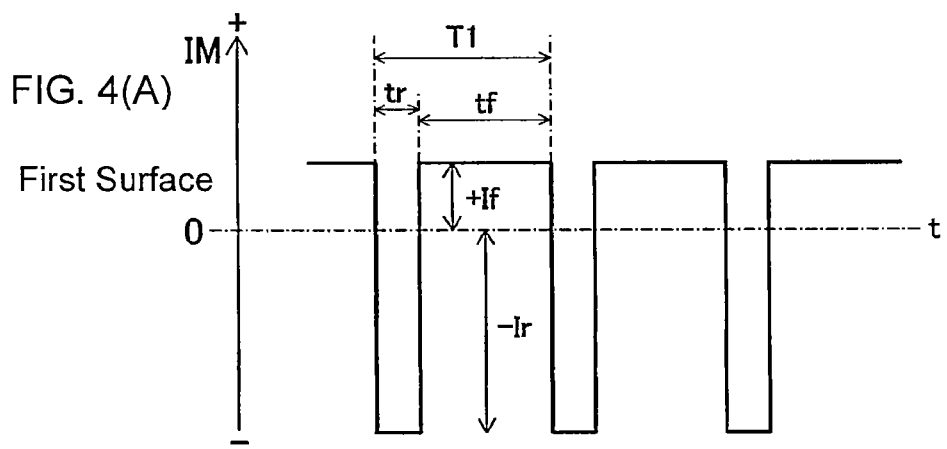
FIG. 4(A) First Surface
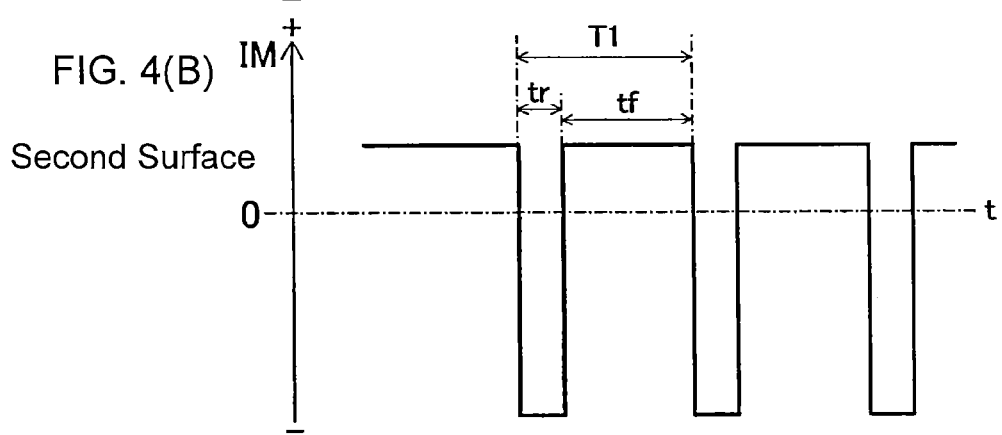
FIG. 4(B) Second Surface
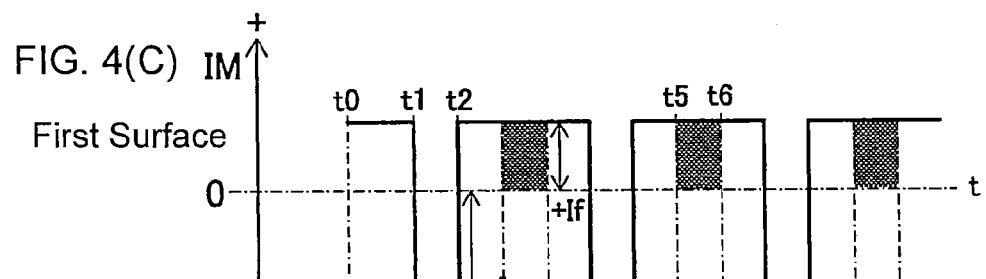
FIG. 4(C) First Surface
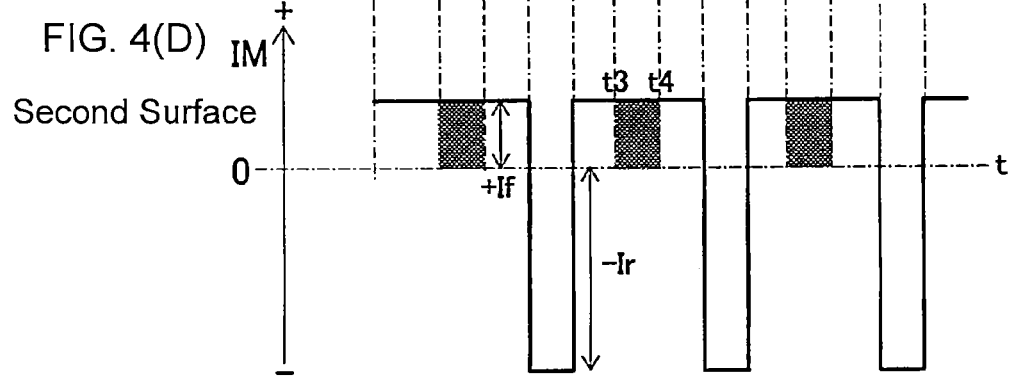
FIG. 4(D) Second Surface → :Deposition
--→ :Dissolution → : Deposition
--→ : Dissolution

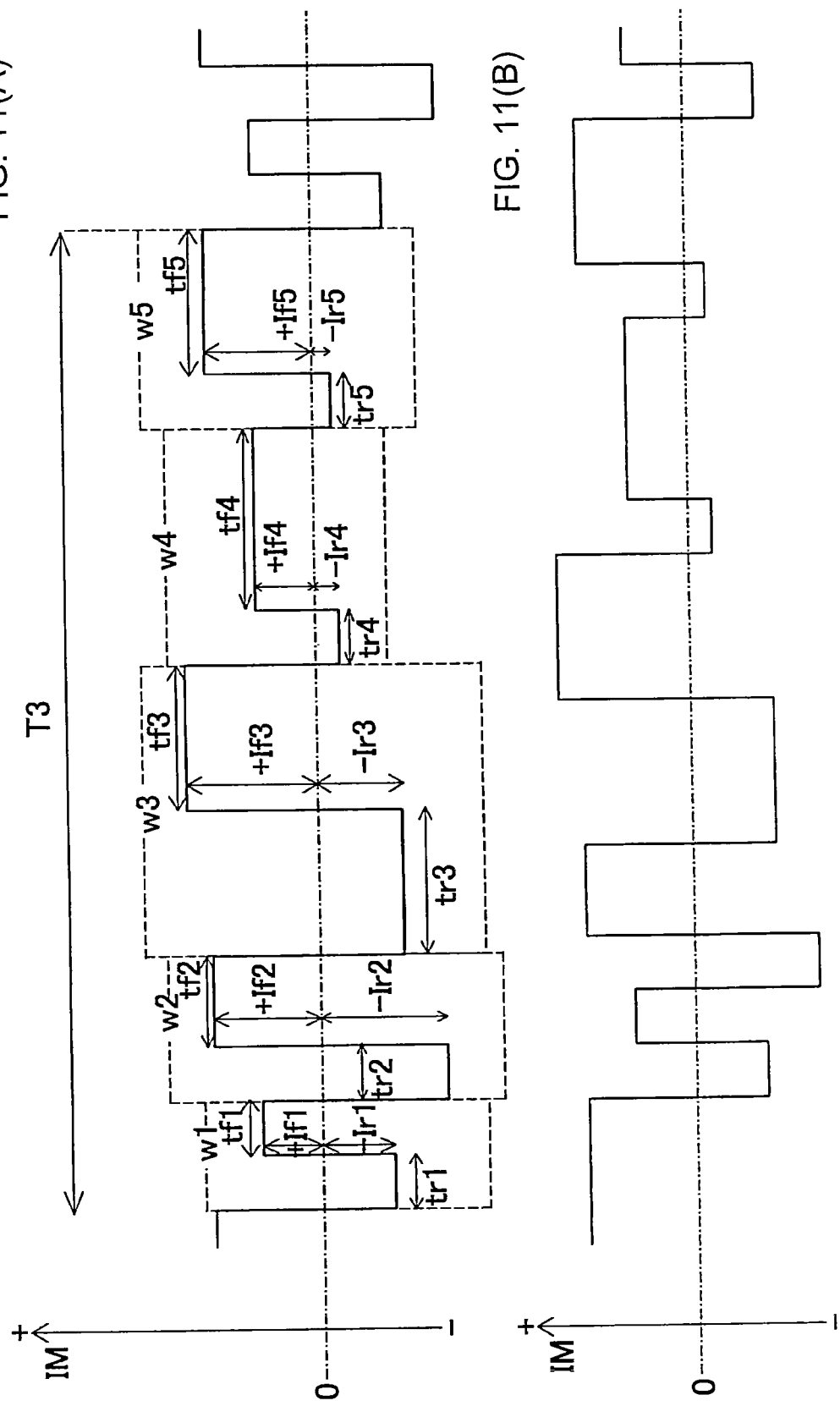

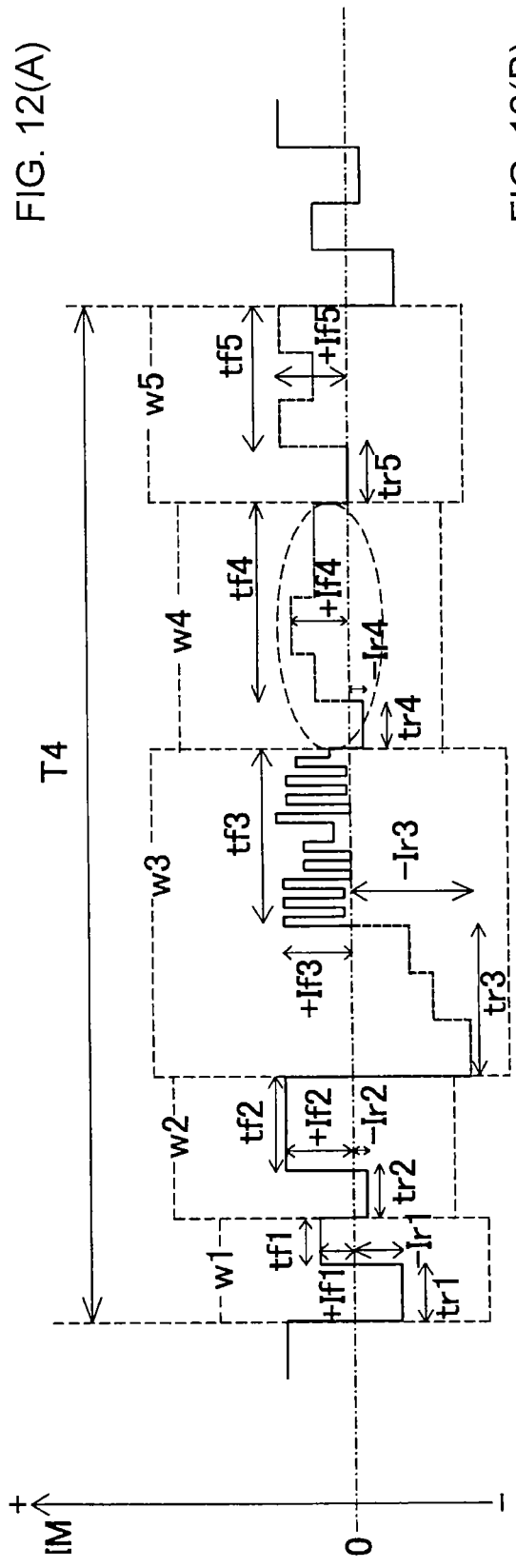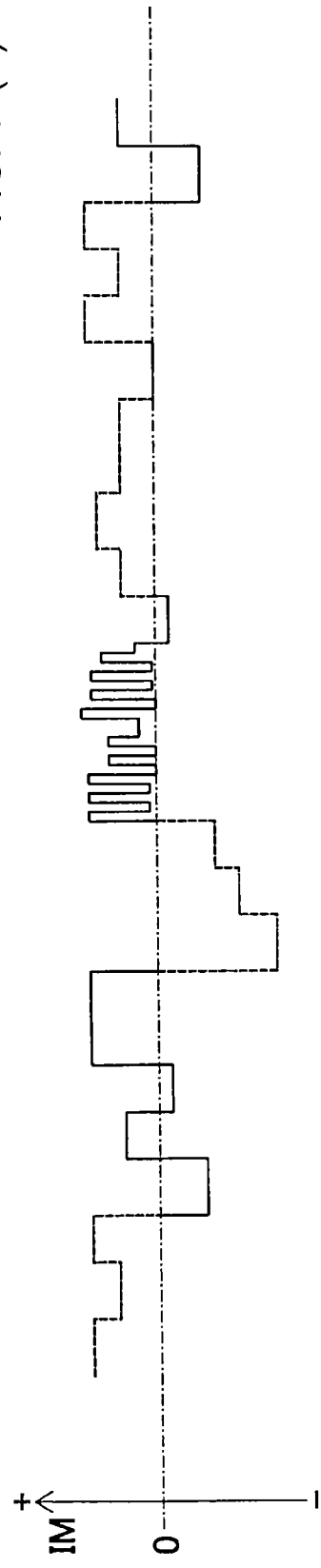
FIG. 12(A)
FIG. 12(B)

METHOD FOR MANUFACTURING PRINTED WIRING BOARD

CROSS-REFERENCE TO RELATED APPLICATIONS

The present application is based upon and claims the benefit of priority to Japanese Patent Application No. 2013-248317, filed Nov. 29, 2013, the entire contents of which are incorporated herein by reference.

BACKGROUND OF THE INVENTION

1. Field of the Invention

The present invention relates to a method for manufacturing a printed wiring board that includes forming a through-hole conductor in a through hole by pulse plating.

2. Description of Background Art

Japanese Translation of PCT International Application Publication No. 2008-513985 relates to an electrical treatment for filling a metal in a through hole. FIG. 3 of Japanese Translation of PCT International Application Publication No. 2008-513985 illustrates current waveforms used in a test of Japanese Translation of PCT International Application Publication No. 2008-513985. The entire contents of this publication are incorporated herein by reference.

SUMMARY OF THE INVENTION

According to one aspect of the present invention, a method for manufacturing a printed wiring board includes forming a through hole in an insulating substrate such that the through hole extends from a first surface of the insulating substrate to a second surface of the insulating substrate on the opposite side with respect to the first surface of the insulating substrate, forming a seed layer on the first surface of the insulating substrate, the second surface of the insulating substrate, and a wall of the through hole, and applying pulse plating to the insulating substrate via the seed layer such that a through-hole conductor is formed in the through hole. The applying of the pulse plating includes flowing a forward current and a reverse current on the first surface of the insulating substrate and flowing a forward current and a reverse current on the second surface of the insulating substrate such that when the forward current flows on the first surface of the insulating substrate, the reverse current flows on the second surface of the insulating substrate and that when the reverse current flows on the first surface of the insulating substrate, the forward current flows on the second surface of the insulating substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A-4D illustrate current waveforms according to a manufacturing method of the first embodiment.

FIGS. 5B1, 5B2, 5C1 and 5C2 illustrate schematic diagrams illustrating mechanisms of plating deposition and plating dissolution of the first embodiment.

FIGS. 6B1, 6B2, 6C1 and 6C2 illustrate mechanisms of plating deposition and plating dissolution of the reference example.

FIGS. 11A and 11B illustrate a sixth example of current waveforms used in the manufacturing method of the first embodiment.

FIGS. 12A and 12B illustrate a seventh example of current waveforms used in the manufacturing method of the first embodiment.

DETAILED DESCRIPTION OF THE EMBODIMENTS

Figure 1A:
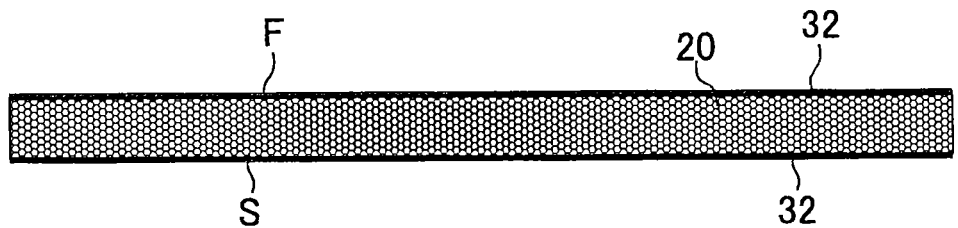
FIGS. 1A-1E illustrate manufacturing process diagrams of a printed wiring board according to a first embodiment of the present invention.

The embodiments will now be described with reference to the accompanying drawings, wherein like reference numerals designate corresponding or identical elements throughout the various drawings.

First Embodiment

Figure 2A:
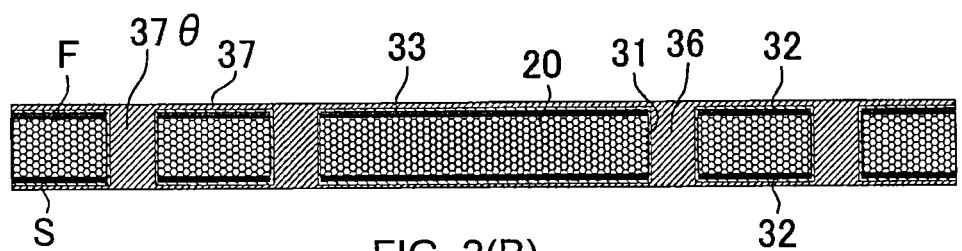
FIG. 2A-2C illustrate manufacturing process diagrams of the printed wiring board of the first embodiment.
Figure 2B:
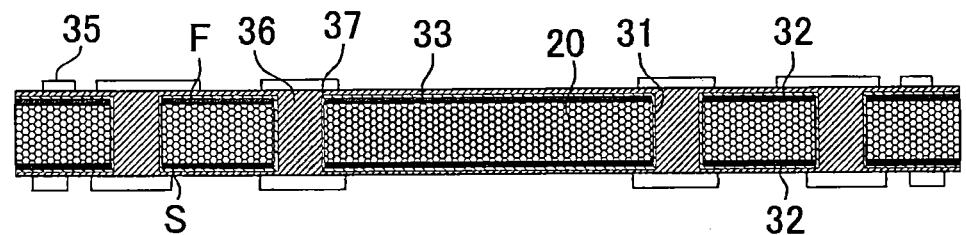
Figure 2C:
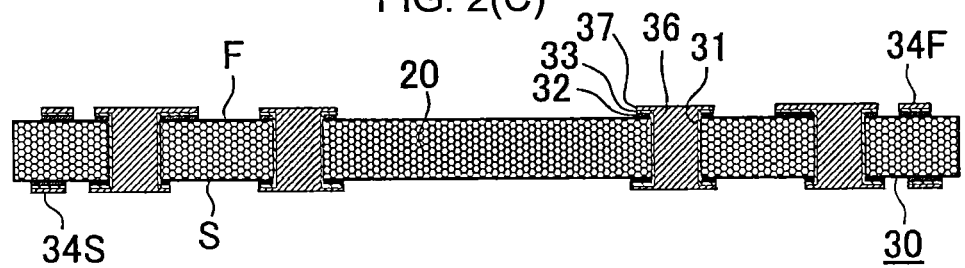

A printed wiring board of a first embodiment is a double-sided board 30 illustrated in FIG. 2C or a build-up wiring board having the double-sided board 30. The double-sided board 30 is used as a core substrate of a build-up wiring board. A build-up wiring board and a core substrate that is used in a build-up wiring board are described, for example, in JP2007-227512A. The entire contents of this publication are incorporated herein by reference.

The double-sided board 30 is formed to include: an insulating substrate 20 that has a first surface F and a second surface (S) that is on an opposite side of the first surface; a through-hole conductor 36 that is formed in a through hole 31 for the through-hole conductor, the through hole 31 penetrating through the insulating substrate 20; a conductor layer (34F) on the first surface (F) of the insulating substrate; and a conductor layer (34S) on the second surface (S). The conductor layer 34F and the conductor layer (34S) are electrically connected by the through-hole conductor.

FIGS. 1A-1E and 2A-2C illustrate a method for manufacturing a printed wiring board according to the first embodiment.

(1) The insulating substrate 20 that is formed from a reinforcing material and a resin is prepared (FIG. 1A). A copper foil 32 is laminated on the first surface (F) and the second surface (S) of the insulating substrate 20. The insulating substrate 20 has a thickness of 2 mm or less, preferably 0.4 mm or less. Examples of the reinforcing material include a glass cloth, aramid fibers, glass fibers, and the like. Examples of the resin include an epoxy resin, a BT (bismaleimide triazine) resin, and the like.

Figure 1B:
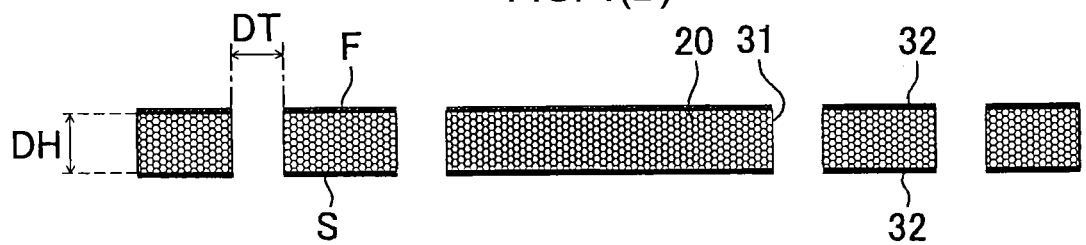

(2) The through hole 31 is formed on the insulating substrate using a drill (FIG. 1B). The through hole has a diameter of 1000 µm or less, preferably 150 µm or less. An aspect ratio of the through hole (through hole length DH/through hole diameter DT) is roughly 0.4-4.5 (FIG. 1B).

Figure 1C:
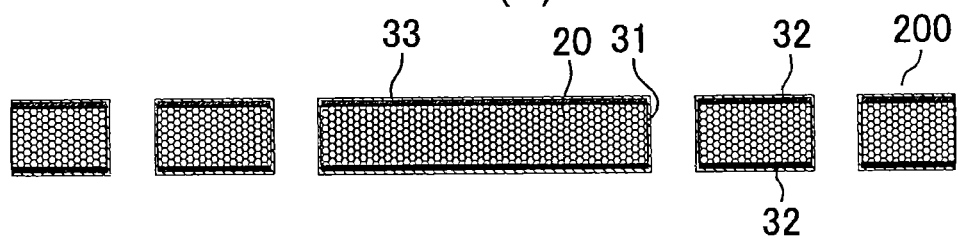

(3) A seed layer 33 is formed on the first surface (F) and the second surface (S) of the insulating substrate 20 and on a wall of the through hole 31 (FIG. 1C). The seed layer is an electroless plating film, a sputtered film, or a vapor-deposited film, that is formed of copper, nickel, or the like.

(4) As illustrated in FIG. 2A, an electrolytic plating film 37 that is formed of copper or nickel is formed on the seed layer 33. The through-hole conductor 36 is formed in the through hole 31. The through hole 31 is filled with the electrolytic plating film, and the through-hole conductor 36 is formed (FIG. 2A).

(5) An etching resist 35 is formed on the electrolytic plating film 37 (FIG. 2B). The electrolytic plating film 37, the seed layer 33 and the copper foil 32 that are exposed from the etching resist are removed. The etching resist is removed. The conductor layers (34F, 34S) that are formed from the electrolytic plating film 37, the seed layer (electroless plating film) 33 and the copper foil 32, and the through-hole conductor 36 that is formed from the seed layer and the electrolytic plating film 37 on the seed layer 33, are formed. A core substrate 30 is completed (FIG. 2C).

Figure 3:
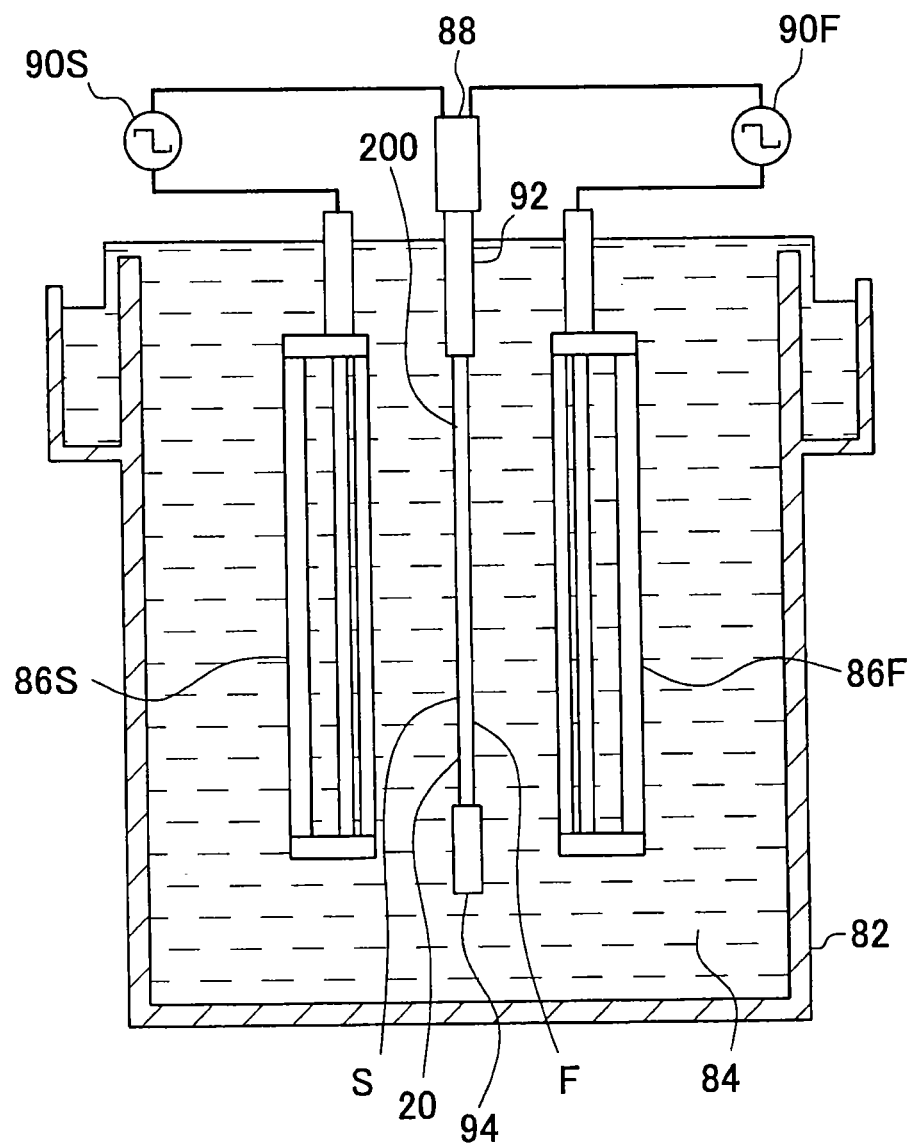
FIG. 3 illustrates an explanatory diagram illustrating an outline of an electrolytic plating apparatus of the first embodiment.

FIG. 3 illustrates an outline of an electrolytic plating apparatus for forming the electrolytic plating film 37.

The electrolytic plating apparatus has a plating path 82. The plating path contains an electrolytic plating solution 84. The electrolytic plating solution contains copper sulfate and sulfuric acid. The electrolytic plating solution further contains, as additives, a commercially available inhibitor, a leveler (smoothing agent), a brightener (accelerant), and the like. Further, it is preferable that the electrolytic plating solution contain divalent iron ions and trivalent iron ions. Even when the first and second conductor layers have thin thicknesses, the through hole can be filled by plating.

An intermediate substrate 200 having the electroless plating film (seed layer) illustrated in FIG. 1C is immersed in the electrolytic plating solution. The intermediate substrate 200 is held in the plating solution by a holder 92. Further, in the plating solution, a first anode (86F) is arranged opposing a first surface (F) of the intermediate substrate. Further, a second anode (86S) is arranged opposing a second surface (S) of the intermediate substrate. The first surface of the intermediate substrate and the first surface of the insulating substrate are the same; and the second surface of the intermediate substrate and the second surface of the insulating substrate are the same. The intermediate substrate 200 is sandwiched by the first anode (86F) and the second anode (86S). It is preferable that the first anode and the second anode be insoluble anodes.

A first rectifier (90F) is arranged between the intermediate substrate and the first anode. The intermediate substrate is electrically connected to the first anode via the holder and the first rectifier. A second rectifier (90S) is arranged between the intermediate substrate and the second anode. The intermediate substrate is electrically connected to the second anode via the holder and the second rectifier. An amount of a current flowing to a seed layer formed on the first surface of the intermediate substrate is controlled by the first rectifier. When an electrolytic plating film is deposited on the seed layer, an amount of a current flowing to the electrolytic plating film on a first seed layer is controlled by the first rectifier.

An amount of a current flowing to a seed layer formed on the second surface of the intermediate substrate is controlled by the second rectifier. When an electrolytic plating film is deposited on the seed layer, an amount of a current flowing to the electrolytic plating film on a second seed layer is controlled by the second rectifier.

A value of a current flowing on the first surface side of the intermediate substrate is controlled by the first rectifier; and a value of a current flowing on the second surface side of the intermediate substrate is controlled by the second rectifier. The values of the currents flowing on to-be-plated surfaces of the first surface side and the second surface side are controlled by the rectifiers.

FIG. 4A-4D illustrate current waveforms that are controlled by the first rectifier (90F) and the second rectifier (90S) according to a manufacturing method of the first embodiment.

FIG. 4A illustrates a waveform of a current flowing on the first surface side of the intermediate substrate 200. The current waveform illustrated in FIG. 4A is controlled by the first rectifier (90F). FIG. 4B illustrates a waveform of a current flowing on the second surface side of the intermediate substrate 200. The current waveform illustrated in FIG. 4B is controlled by the second rectifier (90S). In each of the figures of the current waveforms, a horizontal axis represents time (t), and a vertical axis (IM) represents a current density. A plus value of the vertical axis represents a current density of a forward current; and a minus value of the vertical axis represents a current density of a reverse current.

The current waveforms are periodic and one period T1 is 1100 msec or less, preferably 110 msec or less. Within one period, there is a pulse having a predetermined pulse width. Within one period, there are a deposition pulse having a certain forward current value (current density) and a dissolution pulse having a certain reverse current value (current density). In FIG. 4A-4D, a forward current is illustrated on a plus side, and a reverse current is illustrated on a minus side. When a forward current flows on a to-be-plated surface, plating is deposited on the to-be-plated surface. When a reverse current flows on a to-be-plated surface, a plating film is dissolved from the to-be-plated surface.

A deposition pulse has a pulse width (tf) of 1000 msec or less, preferably 100 msec or less. A forward current has a current density (+If) of a value of 10 A/dm2 or less, preferably 5 A/dm2 or less. Further, A dissolution pulse has a pulse width (tr) of 100 msec or less, preferably 10 msec or less. A reverse current has a current density (−Ir) of a value of −50 A/dm2 or more, preferably −40 A/dm2 or more. It is sufficient for a dissolution pulse to have even a small pulse width. A value of a current density (+If) of a forward current is larger than 0, and a value of a current density (−Ir) of a reverse current is smaller than 0.

In the first embodiment, magnitudes (absolute values) of current densities of forward currents flowing on the first surface side and the second surface side are the same; and magnitudes (absolute values) of current densities of reverse currents flowing on the first surface side and the second surface side are the same. It is preferable that a magnitude (absolute value) of a current density of a forward current be smaller than a magnitude (absolute value) of a current density of a reverse current.

FIG. 4C illustrates a current waveform of the first surface side; and FIG. 4D illustrates a current waveform of the second surface side. As illustrated in the figures, the waveform of FIG. 4C and the waveform of FIG. 4D simultaneously advance. Therefore, from a time t1 to a time t2, a reverse current flows on the first surface side, and a forward current flows on the second surface side. Further, from a time t3 to a time t4, a reverse current flows on the first surface side, and a forward current flows on the second surface side. From a time t5 to a time t6, a forward current flows on the first surface side, and a reverse current flows on the second surface side. A current density of a forward current is +If, and a current density of a reverse current is −Ir.

In FIGS. 4C and 4D, when a magnitude of a current density of a forward current flowing on the second surface between the time t1 and the time t2 is +Iff, the current density+Iff may be larger than the current density+If. The magnitude of the current density+Iff is larger than the magnitude of the current density+If. When a reverse current flows on the other surface (for example, the first surface), a magnitude of a current density of a forward current flowing on one surface (for example, the second surface) is +Iff. Further, when a forward current flows on the other surface (for example, the first surface), a magnitude of a current density of a forward current flowing on one surface (for example, the second surface) is +If. The magnitude of the current density+Iff is larger than the magnitude of the current density+If.

FIGS. 5B1, 5B2, 5C1 and 5C2 illustrate schematic diagrams illustrating mechanisms of plating deposition and plating dissolution of the first embodiment. However, the mechanisms described using FIGS. 5B1, 5B2, 5C1 and 5C2 are based on theories, which may contain mistakes.

Figure 5:
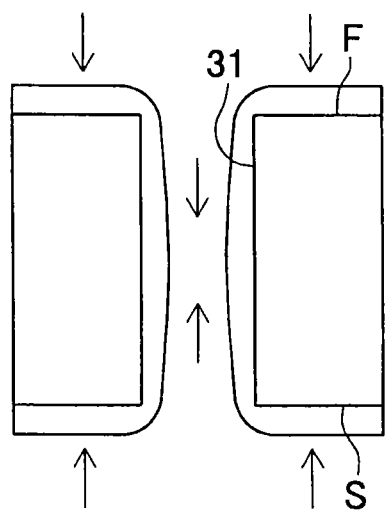
Figure 5:
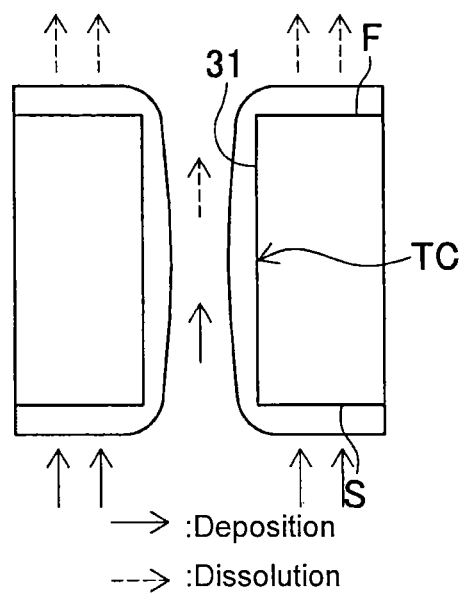
Figure 5:
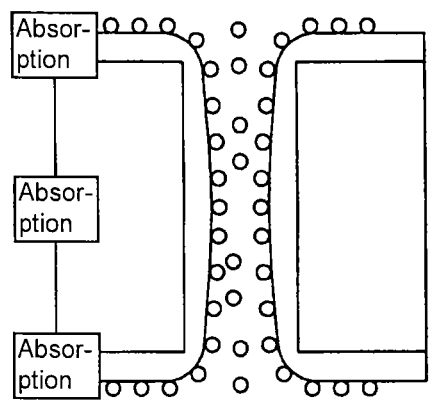
Figure 5:
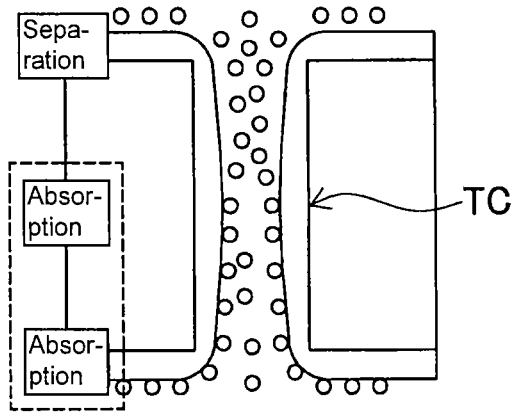

FIGS. 5B1 and 5C1 illustrate states of the first surface side and the second surface side from a time t0 to the time t1 in FIGS. 4C and 4D. FIG. 5B1 illustrates that plating is deposited on a to-be-plated surface. FIG. 5C1 illustrates that an accelerant is absorbed on the to-be-plated surface. As illustrated in FIG. 5B1, plating is being deposited on the first surface (F) and the second surface (S) as well as in the through hole 31. In FIG. 5C1, the accelerant is indicates using circles ○. The accelerant is absorbed on a surface of a plating film that is formed on the first surface (F), the second surface (S) and the through hole 31.

FIGS. 5B2 and 5C2 illustrate states of the first surface side and the second surface side from the time t1 to the time t2 in FIGS. 4C and 4D. A reverse current flows on the first surface side, and a forward current flows on the second surface side. As illustrated in FIG. 5B2, plating is dissolved from the plating film on the first surface (F), and plating is deposited on the plating film on the second surface (S). Further, in the through hole 31, plating is dissolved from the plating film (the plating film deposited on the wall of the through hole) near the first surface, and plating is deposited on the plating film (the plating film deposited on the wall of the through hole) near the second surface. As illustrated in FIG. 5B2, it is presumable that plating is deposited on the plating film of a central portion (TC) of the through hole by a forward current supplied from the second surface side. Further, the plating film dissolves toward the first surface side, and plating is deposited on the plating film from the second surface side. There is directionality in the through hole. Therefore, it is conceivable that plating is efficiently deposited on the central portion (TC). Therefore, according to the first embodiment, the central portion (TC) can be quickly closed by plating. The central portion (TC) is a middle part between the first surface (F) and the second surface (S).

As illustrated in FIG. 5C2, in the through hole 31, the accelerant is removed from the plating film (the plating film deposited on the wall of the through hole) near the first surface, and the accelerant is absorbed on the plating film (the plating film deposited on the wall of the through hole) near the second surface. As illustrated in FIG. 5C2, it is presumable that the plating film of the central portion (TC) of the through hole does not dissolve and thus the accelerant absorbed on the plating film of the central portion (TC) is not removed. It is conceivable that the accelerant is not separated. Since the accelerant is absorbed on the central portion (TC), when a subsequent forward current is applied, plating is easily deposited on the central portion. Therefore, according to the first embodiment, the central portion (TC) can be quickly closed by plating. Since sizes of particles that form the plating film are unlikely to be small, ductility of a through-hole conductor formed using the method of the first embodiment is increased. Reliability of the through-hole conductor is increased. The through-hole conductor is unlikely to deteriorate in a heat cycle.

Further, according to the first embodiment, when plating is performed, deposition or dissolution occurs. Therefore, the plating film is unlikely to contain gaps or voids in the plating film. Reliability of the through-hole conductor is increased. The through-hole conductor is unlikely to deteriorate in a heat cycle.

Figure 6A:
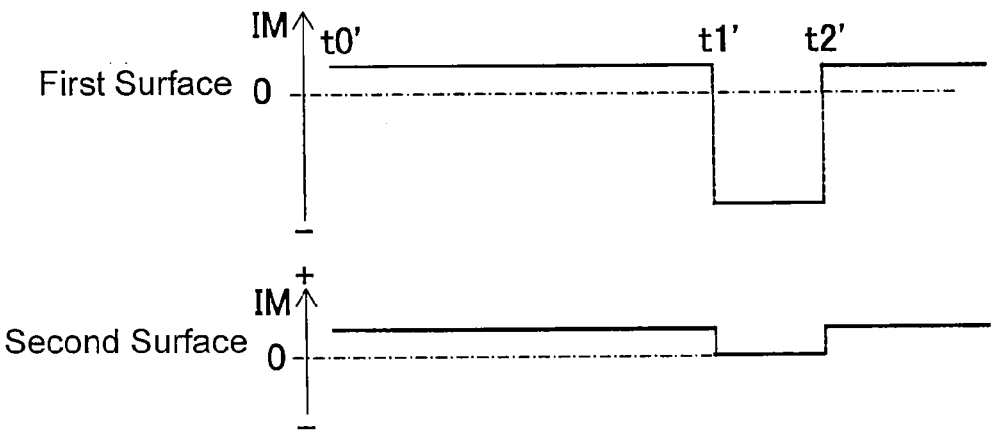
FIG. 6A illustrates current waveforms of a reference example.
Figure 6:
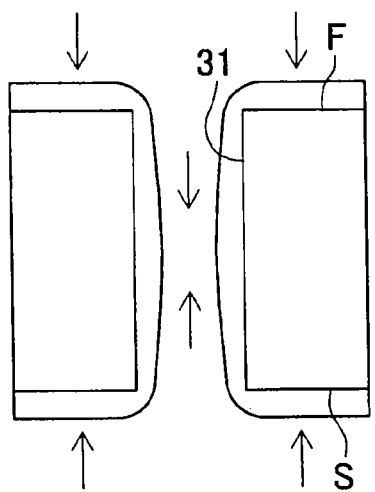
Figure 6:
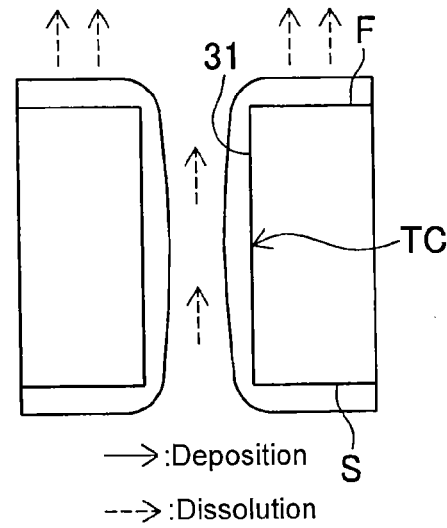
Figure 6:
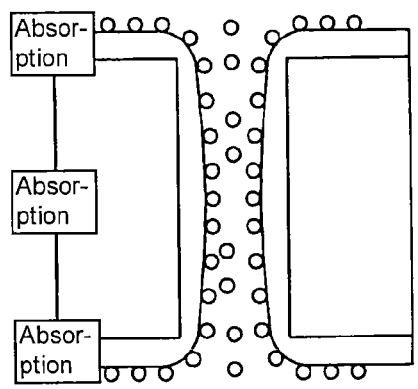
Figure 6:
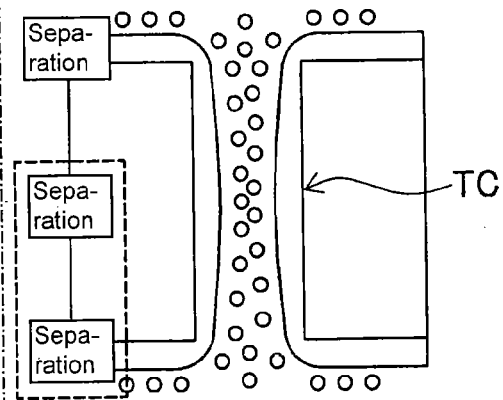

FIG. 6A illustrates current waveforms of a reference example. A current waveform of the first surface side and a current waveform of the second surface side simultaneously advance. In the reference example, from a time t1' to a time t2', a reverse current flows on the first surface side. During that time period, there is no current flowing on the second surface side. A current of the second surface side has a value of 0.

From a time t0' to the time t1', forward currents flow on the first surface side and the second surface side. In this case, as illustrated in FIG. 6B1, plating is being deposited on the first surface (F), the second surface (S) and the wall of the through hole 31. Further, as illustrated in FIG. 6C1, an accelerant is absorbed on the plating film that is formed on the first surface (F), the second surface (S) and the wall of the through hole 31.

FIGS. 6A, 6B1, 6B2, 6C1 and 6C2 illustrate schematic diagrams illustrating mechanisms of plating deposition and plating dissolution according to the reference example of the first embodiment. However, the mechanisms described using FIGS. 6A, 6B1, 6B2, 6C 1 and 6C2 are guesses, which may contain mistakes.

FIGS. 6B2 and 6C2 illustrate states of the first surface side and the second surface side from the time t1' to the time t2' in FIG. 6A. A reverse current flows on the first surface side, and there is no current flowing on the second surface side. The plating film on the second surface side does not dissolve. And, plating is not deposited on the plating film. Further, as illustrated in FIG. 6B2, the plating film formed on the first surface (F) and in the through hole 31 is dissolved. In the reference example, a reverse current flows on one surface (for example, the first surface), and there is no forward current flowing on the other surface (for example, the second surface). Therefore, the plating film formed on the central portion (TC) of the through hole 31 dissolves. Therefore, comparing the embodiment with the reference example regarding plating time for closing the central portion (TC) of the through hole 31 by the plating film, the plating time of the reference example is longer than the plating time of the embodiment. The number of times that dissolution and deposition are performed in the reference example is larger than the number of times that dissolution and deposition are performed in the embodiment. Therefore, sizes of particles that form the through-hole conductor of the reference example are smaller than sizes of particles that form the through-hole conductor of the embodiment. Therefore, the ductility of the through-hole conductor of the reference example is smaller than the ductility of the through-hole conductor of the embodiment. The reliability of the through-hole conductor of the embodiment with respect to a thermal stress is increased.

Further, in the reference example, when there is no current, there is a possibility that the surface of the plating film becomes non-conductive. When on such a plating film a new plating film is deposited, the plating film is likely to contain gaps or voids in the plating film. However, in the embodiment, it is conceivable that either dissolution or deposition occurs. Therefore, the plating film is unlikely to contain gaps or voids in the plating film. According to the embodiment, the through hole can be easily filled by plating. The through hole can be filled by plating in a short time.

As illustrated in FIG. 6B2, under the influence of the reverse current of the first surface side, the accelerant absorbed on the plating film on the first surface (F) comes off. Then, since there is no current on the second surface side, under the influence of the reverse current of the first surface side, the accelerant absorbed on the plating film formed on the wall of the through hole 31 comes off.

The accelerant on the plating film is separated from the plating film. The accelerant is removed. Therefore, when a subsequent forward current flows on the first surface side, the accelerant is preferentially absorbed on the plating film on the first surface. The accelerant is unlikely to reach the central portion (TC) of the through hole 31. Therefore, in the reference example, it is difficult to close the central portion (TC) by plating. Or, it takes time. A low current density is required.

With reference to FIGS. 1A-1E and 2A-2C, a method for forming an electrolytic plating film of the first embodiment is described.

Figure 1D:
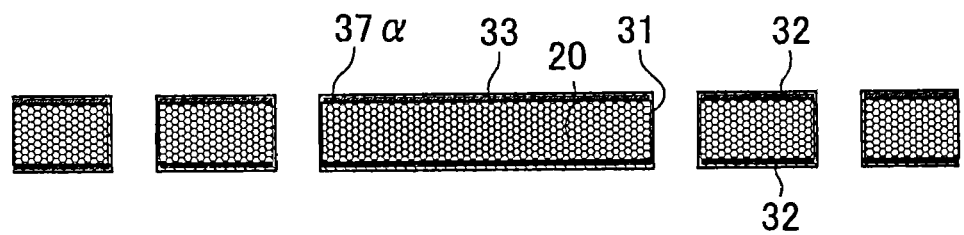
Figure 1E:
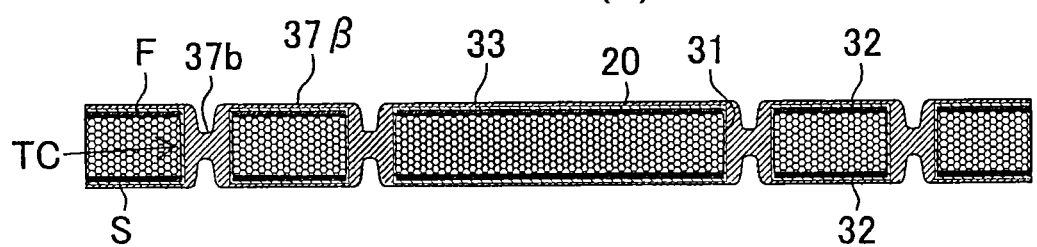

The intermediate substrate 200 illustrated in FIG. 1C is held in the plating path as illustrated in FIG. 3. A current is supplied from the rectifier to the seed layer. First, forward currents are caused to flow on the first surface and the second surface. An electrolytic plating film (first electrolytic plating film) (37α) is formed on the seed layer (FIG. 1D). The electrolytic plating film (37α) has a thickness of about 1 μm-3 μm. Thereafter, by the current waveforms illustrated FIGS. 4A and 4B, an electrolytic plating film (second electrolytic plating film) (37β) is formed on the first surface, the second surface and the wall of the through hole. The formation of the electrolytic plating film (37a) is non-essential. However, in order to reduce a risk that the seed layer disappears due to a reverse current, it is preferable that the electrolytic plating film (first electrolytic plating film) (37a) be formed by DC plating before supplying a reverse current. It is preferable that the electrolytic plating film (first electrolytic plating film) (37α) be formed by DC plating before pulse plating starts. By the current waveforms illustrated in FIGS. 4A and 4B, as illustrated in FIG. 1E, the central portion (TC) of the through hole 31 is closed by the plating film (37β). A bridge part (37b) crossing the through hole is formed at the central portion (TC) of the through hole 31. Thereafter, DC currents (forward currents) are continuously supplied to the first surface and the second surface. As illustrated in FIG. 2A, when an electrolytic plating film (third electrolytic plating film) (37θ) is formed to an end part of the through hole, the plating process is completed. Two ends of the through hole are closed by the electrolytic plating film 37. The electrolytic plating film 37 is formed by the first electrolytic plating film (37α), the second electrolytic plating film (37β) on the first electrolytic plating film (37α), and the third electrolytic plating film (37θ) of the second electrolytic plating film (37β). Filling of the through hole may also be performed by pulse plating.

The method of the first embodiment for manufacturing a printed wiring board includes causing a forward current to flow on the second surface (S) side of the insulating substrate 20 when a reverse current flows on the first surface (F) side of the insulating substrate. The method of the first embodiment for manufacturing a printed wiring board may further include causing a forward current to flow on the first surface (F) side of the insulating substrate when a reverse current flows on the second surface (S) side of the insulating substrate. That is, when a reverse current flows on one surface, a forward current flows on the other surface. Due to the forward current, dissolution of copper at the central portion (TC) of the through hole 31 is suppressed. The bridge part (37b) is quickly formed at the central portion (TC) of the through hole. Therefore, productivity is high. Further, since a plating film is formed in a short time, particle sizes of the metal forming the plating film are likely to be large. The ductility of the through-hole conductor is high. The reliability of the through-hole conductor with respect to a thermal stress is increased.

Modified Example of First Embodiment

FIG. 7A-7D illustrate a method for manufacturing a printed wiring board according to a modified example of the first embodiment.

In the modified example of the first embodiment, the through hole 31 of the insulating substrate 20 is formed using laser.

Figure 7A:
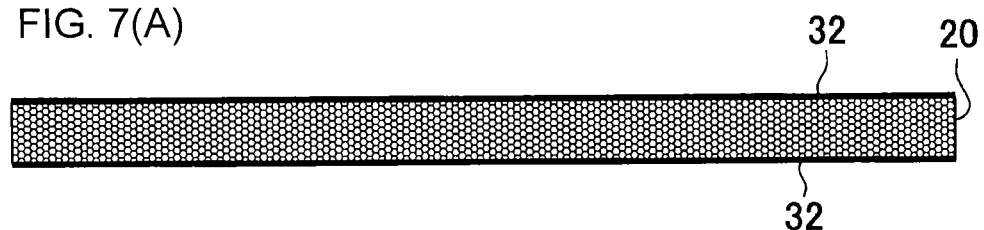
FIG. 7A-7D illustrate manufacturing process diagrams of a printed wiring board according to a modified example of the first embodiment.

(1) The insulating substrate 20 that is formed from a reinforcing material and a resin is prepared (FIG. 7A). A copper foil 32 is laminated on the first surface (F) and the second surface (S) of the insulating substrate 20. A surface of the copper foil 32 is subjected to blackening treatment.

Figure 7B:
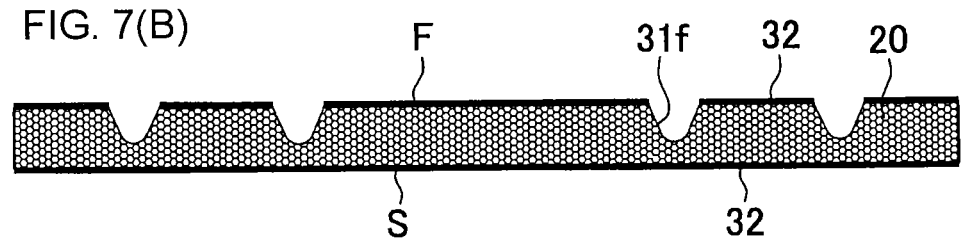

(2) A first opening part (31f) is formed on the first surface (F) side of the insulating substrate 20 using CO2 laser from the first surface (F) side of the insulating substrate 20 (FIG. 7B).

Figure 7C:
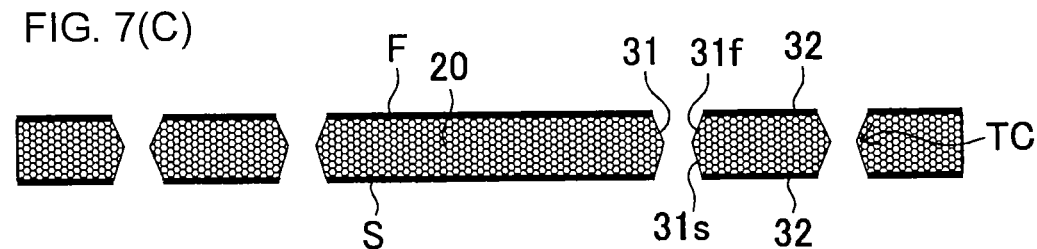
Figure 7D:
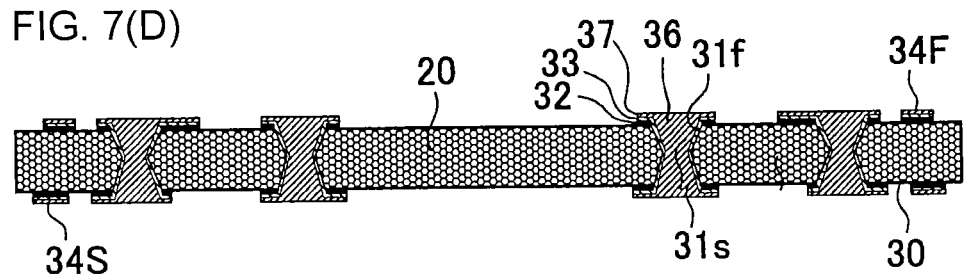

A second opening part (31s) is formed using CO2 laser from the second surface (S) side of the insulating substrate 20 (FIG. 7C). The first opening part and the second opening part are connected in the insulating substrate 20. The through hole 31 in a hourglass shape is formed. Thereafter, using the same method as in the first embodiment, the core substrate is formed (FIG. 7D).

In the modified example of the first embodiment, the substantial central portion (TC) of the through hole 31 is narrowed. Therefore, the substantial central portion (TC) of the through hole 31 can be closed by plating in a short time. Comparing the first embodiment with the modified example of the first embodiment regarding the time until the substantial central portion (TC) of the through hole 31 is closed, the time in the modified example is shorter. Therefore, the modified example of the first embodiment has an effect equal to or better than that of the first embodiment.

Figure 8A:
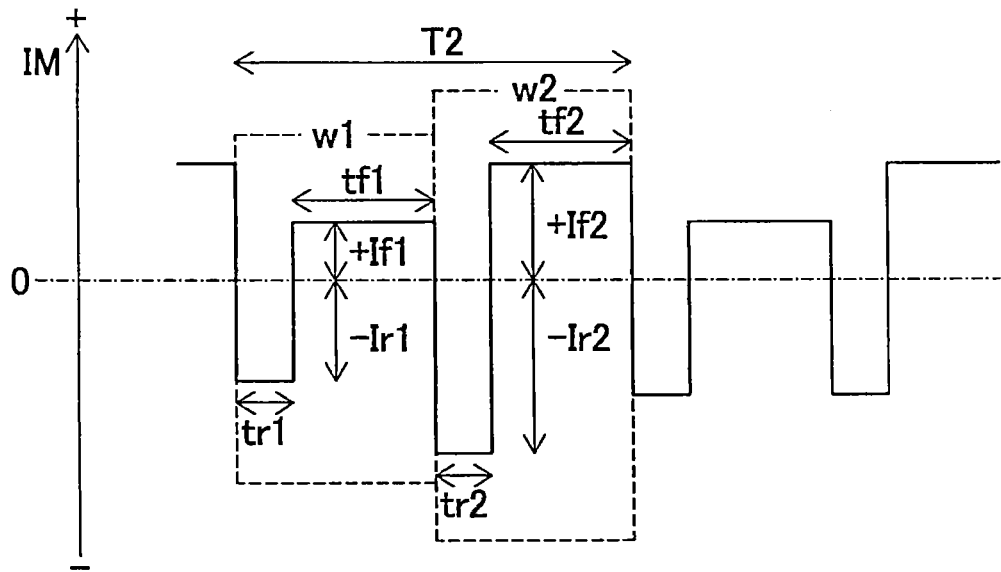
FIGS. 8A and 8B illustrate a first example of current waveforms used in the manufacturing method of the first embodiment.
Figure 8B:
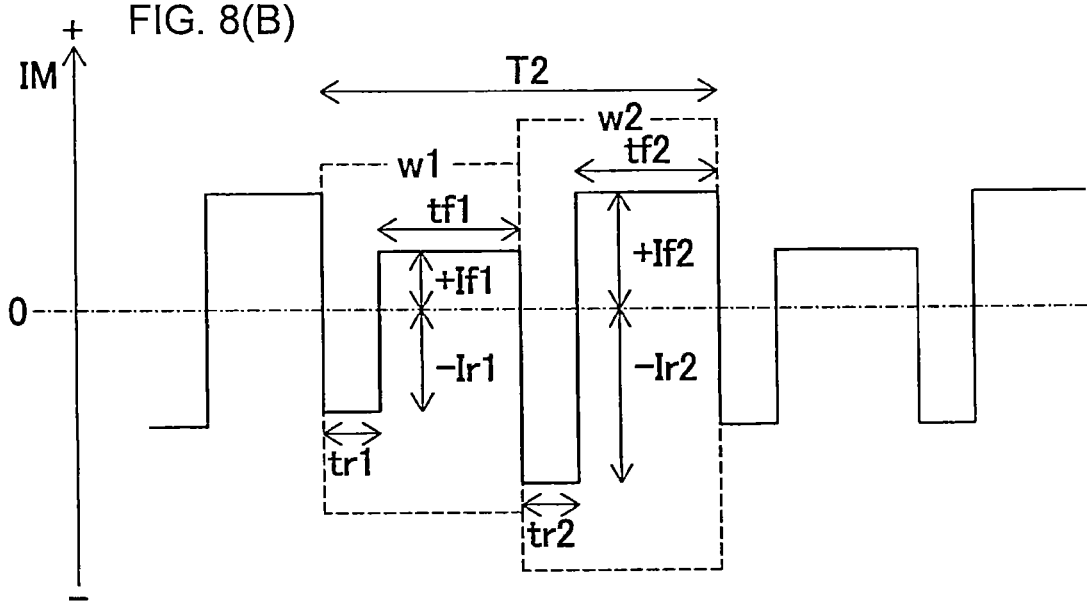

First Example of Current Waveforms Used in Manufacturing Method of First Embodiment FIGS. 8A and 8B illustrate a first example of current waveforms used in the manufacturing method of the first embodiment. FIG. 8A illustrates a current waveform formed by the first rectifier (90F). FIG. 8B illustrates a current waveform formed by the second rectifier (90S).

FIG. 8A illustrates a waveform of a current flowing on the first surface side of the insulating substrate 20. FIG. 8B illustrates a waveform of a current flowing on the second surface side of the insulating substrate 20.

In figures illustrating waveforms of respective examples, a waveform depicted on an upper part illustrates a waveform of a current flowing on the first surface side, and a waveform depicted on a lower part illustrates a waveform of a current flowing on the second surface side.

In the waveform illustrated in FIG. 8A and the waveform illustrated in FIG. 8B, pulse widths and magnitudes of current densities are the same. Further, the waveform illustrated in FIG. 8B and the waveform illustrated in FIG. 8A simultaneously advance and there is a phase difference between the two. It is preferable that the phase difference be 90-270 degrees. The phase difference is adjusted in such a manner that a timing when a reverse current is caused to flow on the first surface and a timing when a reverse current is caused to flow on the second surface do not overlap.

The first example of the current waveforms has a period T2. The period T2 is 2200 msec or less, preferably 220 msec or less. Within one period, there are two kinds of waveforms (a first waveform (w1) and a second waveform (w2)). The first waveform (w1) is formed by a first dissolution pulse and a first deposition pulse. The first dissolution pulse has a pulse width (tr1) of 100 msec or less, preferably 10 msec or less. A first reverse current has a current density (−Ir1) of a value of −50 A/dm2 or more, preferably −40 A/dm2 or more. The first deposition pulse has a pulse width (tf1) of 1000 msec or less, preferably 100 msec or less. A first forward current has a current density (+If1) of a value of 10 A/dm2 or less, preferably 5 A/dm2 or less. The second waveform (w2) is formed by a second dissolution pulse and a second deposition pulse. The second dissolution pulse has a pulse width (tr2) of 100 msec or less, preferably 10 msec or less. A second reverse current has a current density (−Ir2) of a value of −50 A/dm2 or more, preferably −40 A/dm2 or more. The second deposition pulse has a pulse width (tf2) of 1000 msec or less, preferably 100 msec or less. A second forward current has a current density (+If2) of a value of 10 A/dm2 or less, preferably 5 A/dm2 or less.

In the current waveforms of the first example, a magnitude (absolute value) of the current density (−Ir2) of the second reverse current is larger than a magnitude (absolute value) of the current density (−Ir1) of the first reverse current; and a magnitude (absolute value) of the current density (+If2) of the second forward current is larger than a magnitude (absolute value) of the current density (+If1) of the first forward current. In the current waveforms, it is sufficient for a timing of a reverse current flowing on one surface and a timing of a forward current flowing on the other surface to have even a small overlap.

Figure 9A:
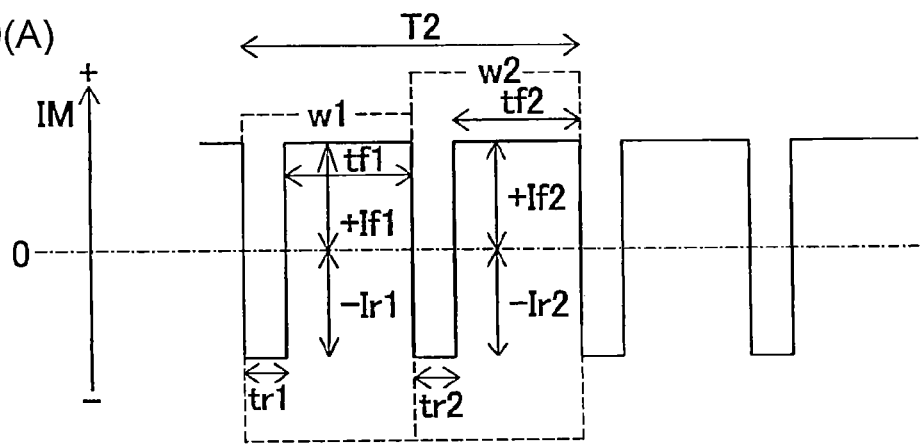
FIGS. 9A and 9B illustrate a second example of current waveforms used in the manufacturing method of the first embodiment.
Figure 9B:
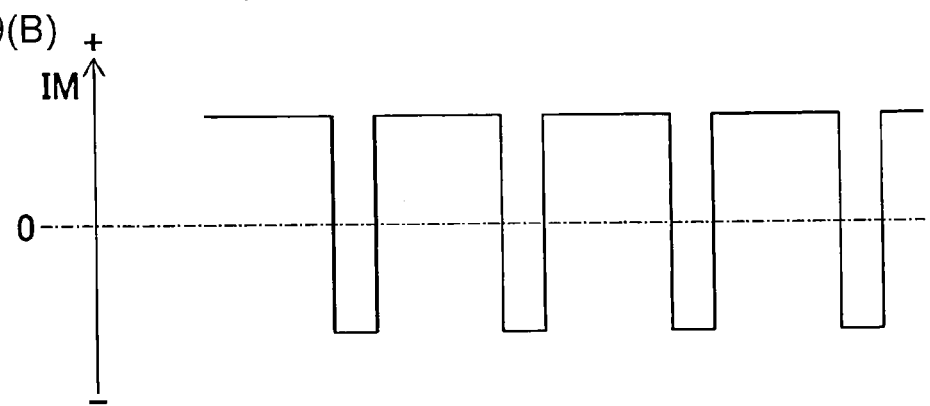

Second Example of Current Waveforms Used in Manufacturing Method of First Embodiment FIGS. 9A and 9B illustrate current waveforms of a second example.

Similar to the first example, the second example has two kinds of waveforms (a first waveform (w1) and a second waveform (w2)) within one period. In the waveform illustrated in FIG. 9A and the waveform illustrated in FIG. 9B, pulse widths and magnitudes of currents are the same. Further, the waveform illustrated in FIG. 9B and the waveform illustrated in FIG. 9A simultaneously advance and there is a phase difference between the two. A value of a current density (−Ir1) of a first reverse current and a value of a current density (−Ir2) of a second reverse current are equal to each other. A value of a current density (+If1) of a first forward current and a value of a current density (+If2) of a second forward current are equal to each other.

Figure 9C:
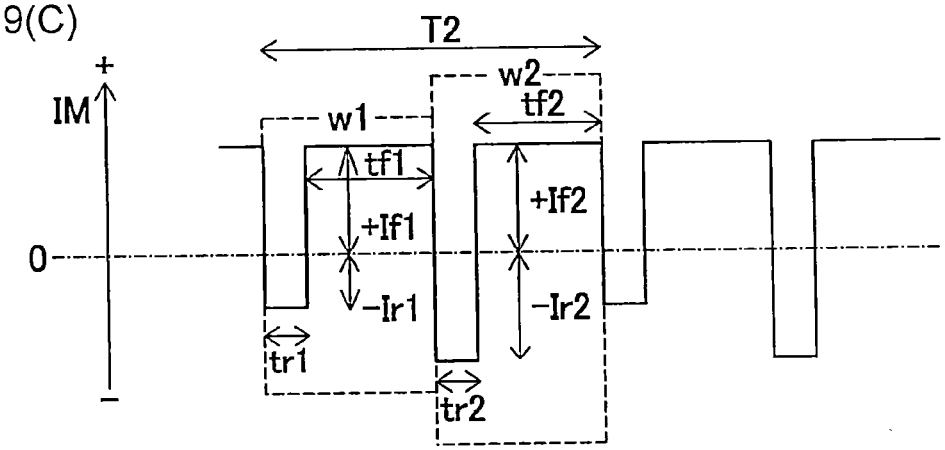
FIGS. 9C and 9D illustrate a third example of current waveforms used in the manufacturing method of the first embodiment.
Figure 9D:
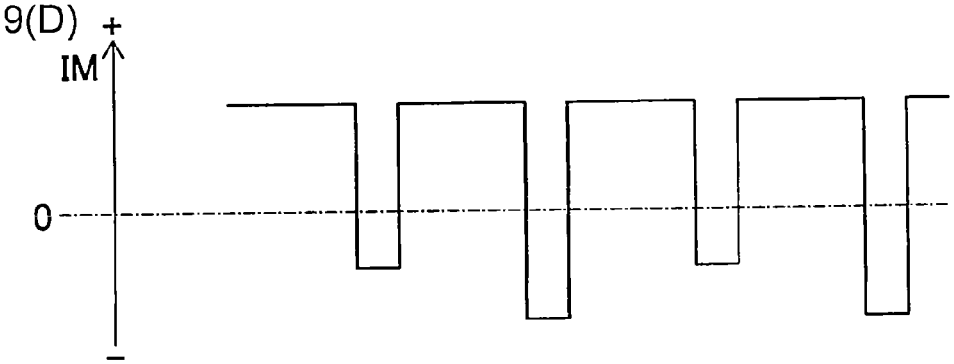

Third Example of Current Waveforms Used in Manufacturing Method of First Embodiment FIGS. 9C and 9D illustrate current waveforms of a third example.

Similar to the first example, the third example has two kinds of waveforms (a first waveform (w1) and a second waveform (w2)) within one period. In the waveform illustrated in FIG. 9C and the waveform illustrated in FIG. 9D, pulse widths and magnitudes of current densities are the same. Further, the waveform illustrated in FIG. 9C and the waveform illustrated in FIG. 9D simultaneously advance and there is a phase difference between the two. In third example, a value of a current density (+If1) of a first forward current and a value of a current density (+If2) of a second forward current are equal to each other. A value of a current density (−Ir1) of a first reverse current and a value of current density (−Ir2) of a second reverse current are different from each other. For example, a magnitude (absolute value) of the current density (−Ir1) of the first reverse current is smaller than a magnitude (absolute value) of the current density (−Ir2) of the second reverse current. In the third example, an amount of dissolution during a first dissolution pulse is small. The substantial central portion (TC) of the through hole can be quickly closed.

Figure 10A:
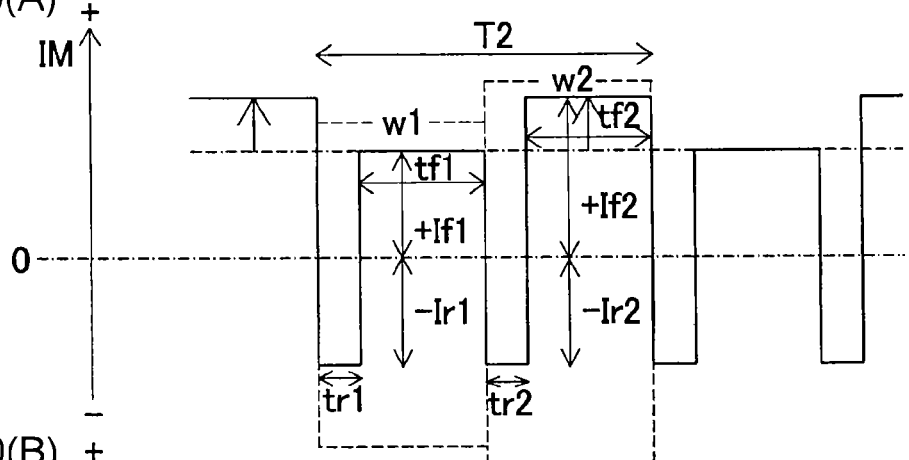
FIGS. 10A and 10B illustrate a fourth example of current waveforms used in the manufacturing method of the first embodiment.
Figure 10B:
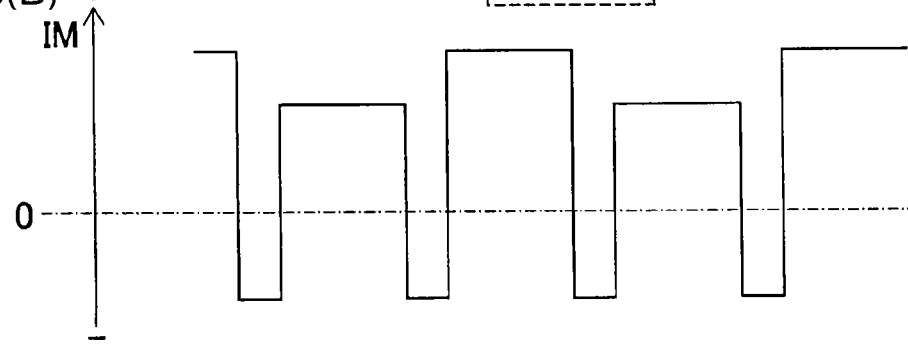

Fourth Example of Current Waveforms Used in Manufacturing Method of First Embodiment FIGS. 10A and 10B illustrate current waveforms of a fourth example.

Similar to the first example, the fourth example has two kinds of waveforms (a first waveform (w1) and a second waveform (w2)) within one period. In the waveform illustrated in FIG. 10A and the waveform illustrated in FIG. 10B, pulse widths and magnitudes of currents are the same. Further, the waveform illustrated in FIG. 10A and the waveform illustrated in FIG. 10B simultaneously advance and there is a phase difference between the two.

In the fourth example, a value of a current density (+If1) of a first forward current and a value of a current density (+If2) of a second forward current are different from each other. A value of a current density (−Ir1) of a first reverse current and a value of current density (−Ir2) of a second reverse current are equal to each other. For example, when the value of the current density (+If2) of the second forward current is larger than the value of the current density (+If1) of the first forward current, an amount of deposition during a second deposition pulse is large, and thus the substantial central portion (TC) of the through hole can be quickly closed.

Figure 10C:
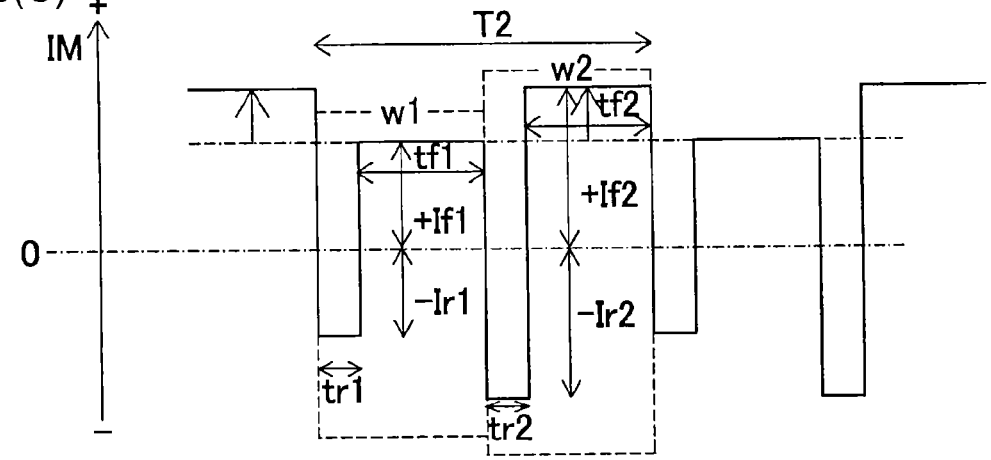
FIGS. 10C and 10D illustrate a fifth example of current waveforms used in the manufacturing method of the first embodiment.
Figure 10D:
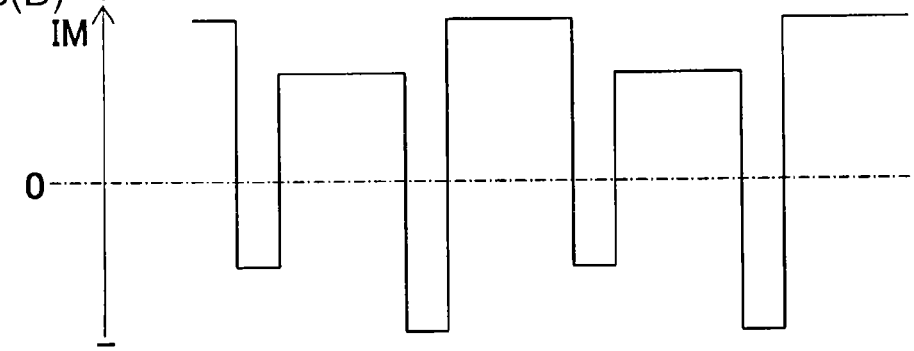

Fifth Example of Current Waveforms Used in Manufacturing Method of First Embodiment FIGS. 10C and 10D illustrate current waveforms of a fifth example.

Similar to the first example, the fifth example has two kinds of waveforms (a first waveform (w1) and a second waveform (w2)) within one period. In the waveform illustrated in FIG. 10C and the waveform illustrated in FIG. 10D, pulse widths and magnitudes of currents are the same. Further, the waveform illustrated in FIG. 10C and the waveform illustrated in FIG. 10D simultaneously advance and there is a phase difference between the two.

In the fifth example, a value of a current density (+If1) of a first forward current and a value of a current density (+If2) of a second forward current are different from each other. A value of a current density (−Ir1) of a first reverse current and a value of a current density (−Ir2) of a second reverse current are different from each other. For example, when a magnitude (absolute value) of the current density (+If2) of the second forward current is larger than a magnitude (absolute value) of the current density (+If1) of the first forward current, an amount of deposition during a second deposition pulse is large. Further, when a magnitude (absolute value) of the current density (−Ir1) of the first reverse current is smaller than a magnitude (absolute value) of the current density (−Ir2) of the second reverse current, an amount of dissolution during a first dissolution pulse is small. The substantial central portion (TC) of the through hole can be quickly closed.

Sixth Example of Current Waveforms Used in Manufacturing Method of First Embodiment FIGS. 11A and 11B illustrate current waveforms of a sixth example.

In the waveform illustrated in FIG. 11A and the waveform illustrated in FIG. 11B, pulse widths and magnitudes of currents are the same. Further, the waveform illustrated in FIG. 11A and the waveform illustrated in FIG. 11B simultaneously advance and there is a phase difference between the two. It is preferable that the phase difference be 90-270 degrees. In FIGS. 11A and 11B, a dissolution pulse of the first surface side and a dissolution pulse of the second surface side partially overlap. It is desirable that the phase difference or the waveforms be adjusted in such a manner that a reverse current of the first surface side and a reverse current of the second surface side do not overlap.

The current waveforms of the sixth example are periodic. A period T3 is 1100×n msec or less, preferably 110×n msec or less; and there are n kinds (where n is an integer equal to or larger than 3) of waveforms within one period T3. In the sixth example, within one period, there are five kinds of waveforms (a first waveform (w1), a second waveform (w2), a third waveform (w3), a fourth waveform (w4), and a fifth waveform (w5)). The first waveform (w1) is formed by a first dissolution pulse (pulse width (tr1)) and a first deposition pulse (pulse width (tf1)). A first reverse current of the first dissolution pulse has a current density (−Ir1) of a value of −50 A/dm2 or more, preferably −40 A/dm2 or more. A first forward current has a current density (+If1) of a value of 10 A/dm2 or less, preferably 5 A/dm2 or more. The second waveform (w2) is formed by a second dissolution pulse (pulse width (tr2)) and a second deposition pulse (pulse width (tf2)). A second reverse current of the second dissolution pulse has a current density (−Ir2) of a value of −50 A/dm2 or more, preferably −40 A/dm2 or more. A second forward current of the second deposition pulse has a current density (+If2) of a value of 10 A/dm2 or less, preferably 5 A/dm2 or less. The third waveform (w3) is formed by a third dissolution pulse (pulse width (tr3)) and a third deposition pulse (pulse width (tf3)). A third reverse current of the third dissolution pulse has a current density (−Ir3) of a value of −50 A/dm2 or more, preferably −40 A/dm2 or more. A third forward current of the third deposition pulse has a current density (+If3) of a value of 10 A/dm2 or less, preferably 5 A/dm2 or less. The fourth waveform (w4) is formed by a fourth dissolution pulse (pulse width (tr4)) and a fourth deposition pulse (pulse width (tf4)). A fourth reverse current of the fourth dissolution pulse has a current density (−Ir4) of a value of −50 A/dm2 or more, preferably −40 A/dm2 or more. A fourth forward current of the fourth deposition pulse has a current density (+If4) of a value of 10 A/dm2 or less, preferably 5 A/dm2 or less. The fifth waveform (w5) is formed by a fifth dissolution pulse (pulse width (tr5)) and a fifth deposition pulse (pulse width (tf5)). A fifth reverse current of the fifth dissolution pulse has a current density (−Ir5) of a value of −50 A/dm2 or more, preferably −40 A/dm2 or more. A fifth forward current of the fifth deposition pulse has a current density (+If5) of a value of 10 A/dm2 or less, preferably 5 A/dm2 or less. The pulse widths (tr1, tr2, tr3, tr4, tr5) of the respective dissolution pulses are 100 msec or less, preferably 10 msec or less. The pulse widths (tf1, tf2, tf3, tf4, tf5) of the respective deposition pulses are 1000 msec or less, preferably 100 msec or less.

In the sixth example, similar to the first embodiment, the substantial central portion (TC) of the through hole can be quickly closed. For example, when a magnitude (absolute value) of the current density (+I12) of the second forward current is larger than a magnitude (absolute value) of the current density (+If1) of the first forward current, an amount of deposition during a second deposition pulse is large. Further, when a magnitude (absolute value) of the current density (−Ir1) of the first reverse current is smaller than a magnitude (absolute value) of the current density (−Ir2) of the second reverse current, an amount of dissolution during a first dissolution pulse is small. The substantial central portion (TC) of the through hole can be quickly closed.

Seventh Example of Current Waveforms Used in Manufacturing Method of First Embodiment FIGS. 12A and 12B illustrate current waveforms of a seventh example.

In the waveform illustrated in FIG. 12A and the waveform illustrated in FIG. 12B, pulse widths and magnitudes of currents are the same. Further, the waveform illustrated in FIG. 12A and the waveform illustrated in FIG. 12B simultaneously advance and there is a phase difference between the two. The phase difference is 90-270 degrees. In FIGS. 12A and 12B, a dissolution pulse of the first surface side and a dissolution pulse of the second surface side partially overlap. Further, during a predetermined time period, a current density is 0. However, it is desirable that the phase difference or the waveforms be adjusted in such a manner that a reverse current of the first surface side and a reverse current of the second surface side do not overlap. Further, it is preferable that the current density be not 0 when plating is being performed.

The current waveforms of the seventh example each have m kinds (where m is an integer equal to or larger than 2) of waveforms within one period T4. The seventh example has five kinds of waveforms (a first waveform (w1), a second waveform (w2), a third waveform (w3), a fourth waveform (w4), and a fifth waveform (w5)). Further, at least one waveform within one period has multiple deposition pulses or multiple dissolution pulses. One waveform may also have multiple deposition pulses and multiple dissolution pulses. For example, the fourth waveform (w4) has one dissolution pulse and three deposition pulses. It is preferable that, when a dissolution pulse is supplied to one surface, a deposition pulse having a largest current density be supplied to the other surface. Dissolution at the central portion (TC) of the through hole is suppressed. The substantial central portion (TC) of the through hole can be quickly closed.

Figure 13A:
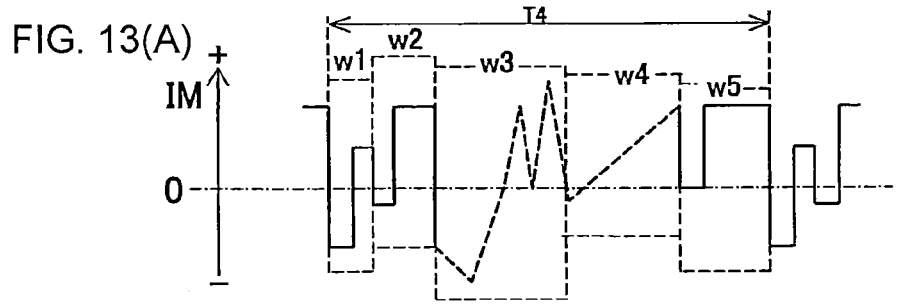
FIG. 13A illustrates an eighth example of current waveforms used in the manufacturing method of the first embodiment.

Eighth Example of Current Waveforms Used in Manufacturing Method of First Embodiment FIG. 13A illustrates current waveforms of an eighth example.

The eighth example has multiple waveforms within one period. Further, among the waveforms within one period, at least one waveform linearly varies. In FIG. 13A, a third waveform (w3) and a fourth waveform w4 linearly vary. When a value of a current density linearly varies, a deposition speed and a dissolution speed of copper slowly vary. Defects are unlikely to occur in crystals in a plating film. Therefore, cracks are unlikely to occur in a through-hole conductor due to a thermal stress. A through-hole conductor of a high reliability can be formed.

Figure 13B:
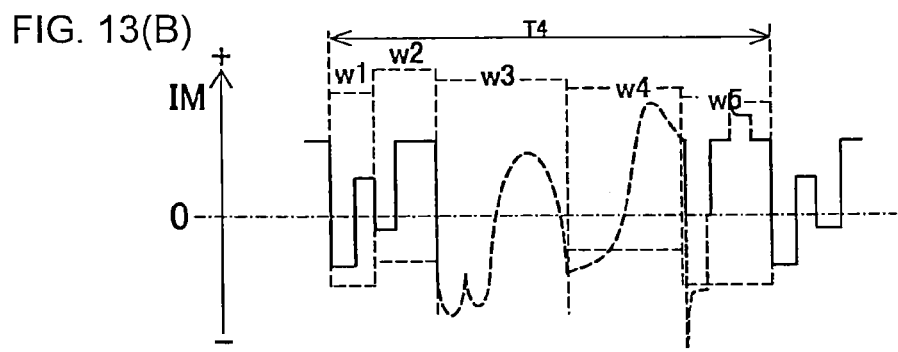
FIG. 13B illustrates a ninth example of current waveforms used in the manufacturing method of the first embodiment.

Ninth Example of Current Waveforms Used in Manufacturing Method of First Embodiment FIG. 13B illustrates current waveforms of a ninth example.

In the ninth example, there are multiple waveforms within one period. Further, among the waveforms within one period, at least one waveform curvedly varies. In FIG. 13B, a third waveform (w3) and a fourth waveform (w4) curvedly vary. When a value of a current density curvedly varies, a deposition speed and a dissolution speed of copper slowly vary. Defects are unlikely to occur in crystals in a plating film. Therefore, cracks are unlikely to occur in a through-hole conductor due to a thermal stress. A through-hole conductor of a high reliability can be formed.

Figure 13C:
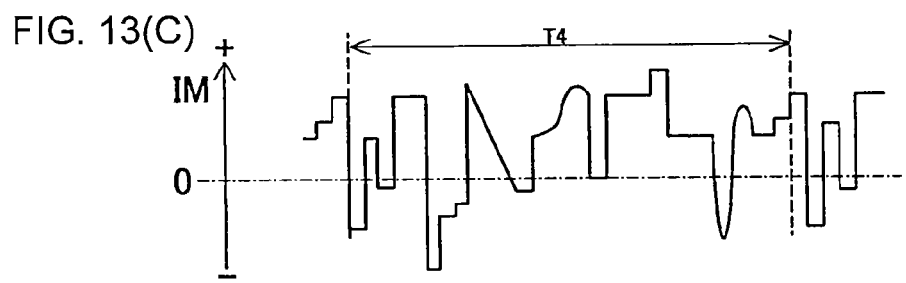
FIG. 13C illustrates a tenth example of current waveforms used in the manufacturing method of the first embodiment.

Tenth Example of Current Waveforms Used in Manufacturing Method of First Embodiment FIG. 13C illustrates current waveforms of a tenth example.

The current waveforms of the tenth example each contain a waveform of a pulse type, a linearly varying waveform and a curvedly varying waveform.

Figure 14A:
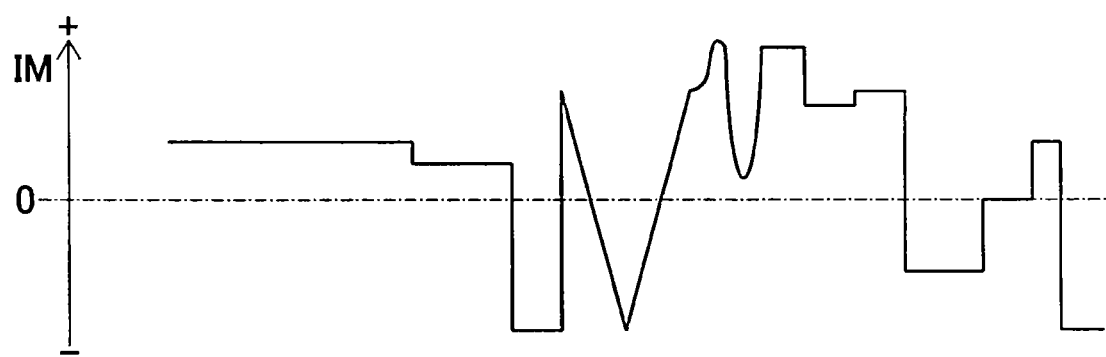
FIGS. 14A and 14B illustrate an eleventh example of current waveforms used in the manufacturing method of the first embodiment.
Figure 14B:
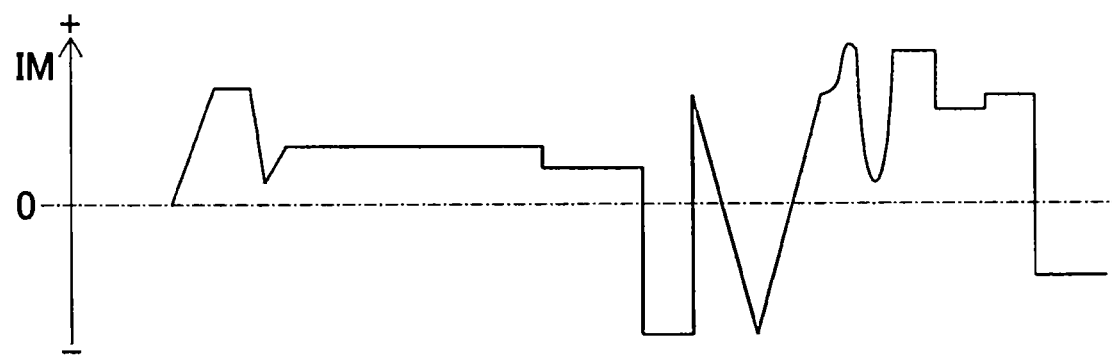

Eleventh Example of Current Waveforms Used in Manufacturing Method of First Embodiment FIGS. 14A and 14B illustrate current waveforms of an eleventh example.

The waveforms of the eleventh example are periodic. The same current waveforms are supplied from the first rectifier (90F) and the second rectifier (90S) to the substrate.

In the eleventh example, when a forward current is supplied to one surface, a reverse current is supplied to the other surface. The substantial central portion (TC) of the through hole can be quickly closed.

Figure 15A:
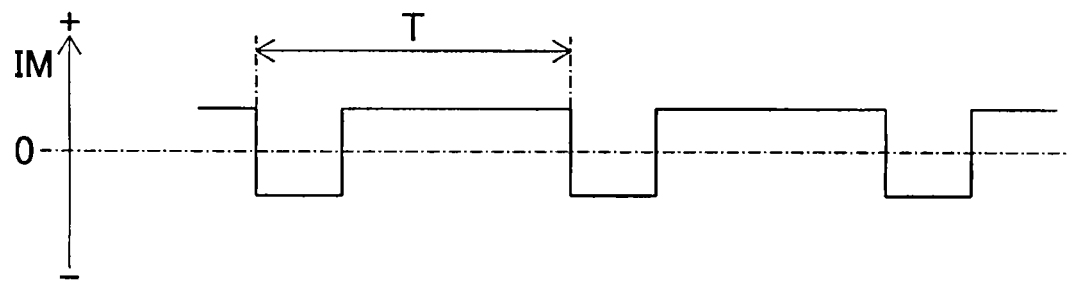
FIGS. 15A and 15B illustrate a twelfth example of current waveforms used in the manufacturing method of the first embodiment.
Figure 15B:
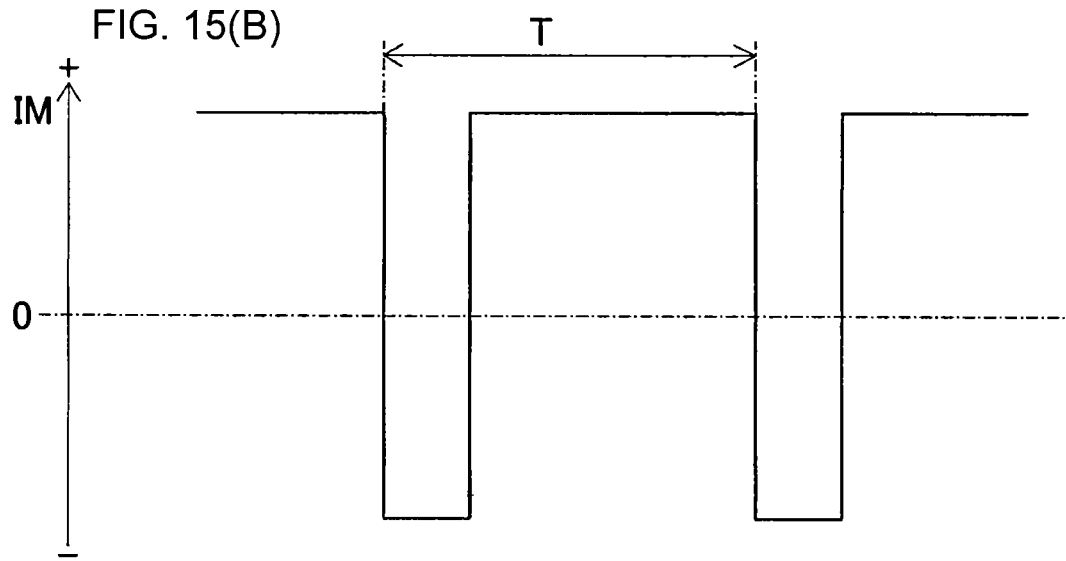

Twelfth Example of Current Waveforms Used in Manufacturing Method of First EMBODIMENT FIGS. 15A and 15B illustrate current waveforms of a twelfth example.

FIG. 15A illustrates a waveform of a current flowing on the first surface side of the insulating substrate 20. FIG. 15B illustrates a waveform of a current flowing on the second surface side of the insulating substrate 20.

A period of the waveform illustrated in FIG. 15A and a period of the waveform illustrated in FIG. 15B are the same.

In the first embodiment, a magnitude (absolute value) of a current density of a current waveform of the first surface side and a magnitude (absolute value) of a current density of a current waveform of the second surface side are the same. In contrast, in the twelfth example, a magnitude (absolute value) of a current density of a current waveform of the first surface side and a magnitude (absolute value) of a current density of a current waveform of the second surface side are different from each other. In the twelfth example, a magnitude (absolute value) of a current density of a forward current of the first surface side is smaller than a magnitude (absolute value) of a current density of a forward current of the second surface side. A thickness of a plating film formed on the first surface side becomes thin. A fine conductor circuit can be formed on the first surface. When a waveform is periodic, a period of a waveform of the first surface side and a period of a waveform of the second surface side are the same in the first embodiment and in each of the examples.

In FIGS. 15A and 15B, a magnitude (absolute value) of a current density of a reverse current of the first surface side is smaller than a magnitude (absolute value) of a current density of a reverse current of the second surface side. However, the magnitude (absolute value) of the current density of the reverse current of the first surface side may be larger than the magnitude (absolute value) of the current density of the reverse current of the second surface side.

It is also possible that the current waveform of the first surface side and the current waveform of the second surface side are not periodic.

It is also possible that a dissolution pulse of the first surface side and a dissolution pulse of the second surface side overlap.

It is desirable that the phase difference or the waveforms be adjusted in such a manner that a dissolution pulse of the first surface side and a dissolution pulse of the second surface side do not overlap.

It is preferable that the current density be not 0 when plating is being performed.

The current waveform of the first surface side and the current waveform of the second surface side may be different. By making an integrated amount of a forward current of the first surface side and a reverse current of the first surface side and an integrated amount of a forward current of the second surface side and a reverse current of the second surface side substantially the same, a thickness of a plating film of the first surface side and a thickness of a plating film of the second surface side can be made substantially the same.

Further, by varying the integrated amount of the currents of the first surface side and the integrated amount of the currents of the second surface, a thin plating film is formed on one surface. Adjustment of an integrated amount of currents is performed by adjusting a magnitude (absolute value) of a current density of a forward current, a magnitude (absolute value) of a current density of a reverse current, a pulse width of a deposition pulse, and a pulse width of a dissolution pulse.

When a reverse current flows on one side, and there is no current flowing on the other side, and further, when a reverse current flows on the other side, there is no current flowing on the one side, is conceivable that, when the reverse current flows, a plating film is mostly dissolved. Further, it is conceivable that a plating film inside a through hole is also dissolved. Therefore, it is presumable that, in order to close a central portion of the through hole in a cross sectional direction by plating, dissolution and deposition are repeated for many times, and that plating time is long. Further, when dissolution and deposition are repeated for many times, it is conceivable that particles of plating that form a through-hole conductor become small and that ductility of the through-hole conductor is decreased. Therefore, it is presumable that reliability of the through-hole conductor with respect to a thermal stress and like is decreased.

If there is a time period during which there is no current flowing on one side and the other side, during the time period, it is conceivable that deposition or dissolution of plating does not occur and that gaps or fine voids are likely to exist between a plating film that is formed by a previous forward current and a plating film that is formed by a subsequent forward current. If a through-hole conductor contains voids, it is presumable that, due to the gaps or voids, the reliability of the through-hole conductor with respect to a thermal stress and the like is decreased.

A method for manufacturing a printed wiring board according to an embodiment of the present invention forms a through-hole conductor of a high reliability. A method for manufacturing a printed wiring board according to an embodiment of the present invention fills a through hole for a through-hole conductor in a short time. A method for manufacturing a printed wiring board according to an embodiment of the present invention forms a through-hole conductor, in a through hole for the through-hole conductor, that does not contain voids that affect the reliability thereof.

A method for manufacturing a printed wiring board according to an embodiment of the present invention includes: forming a through hole on an insulating substrate that has a first surface and a second surface that is on an opposite side of the first surface; forming a seed layer on the first surface of the insulating substrate, the second surface of the insulating substrate, and a wall of the through hole; and forming a through-hole conductor in the through hole by pulse plating by causing a current to flow on the first surface and the second surface of the insulating substrate via the seed layer. The forming of the through-hole conductor includes causing a forward current and a reverse current to flow on the first surface side of the insulating substrate and causing a forward current and a reverse current to flow on the second surface side of the insulating substrate. When the forward current of the first surface side flows on the first surface side of the insulating substrate, the reverse current of the second surface side flows on the second surface side of the insulating substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    forming a through hole in an insulating substrate such that the through hole extends from a first surface of the insulating substrate to a second surface of the insulating substrate on an opposite side with respect to the first surface of the insulating substrate;
    forming a seed layer on the first surface of the insulating substrate, the second surface of the insulating substrate, and a wall of the through hole; and
    applying pulse plating to the insulating substrate via the seed layer such that a through-hole conductor is formed in the through hole,
    wherein the applying of the pulse plating includes flowing a forward current and a reverse current on the first surface of the insulating substrate and flowing a forward current and a reverse current on the second surface of the insulating substrate such that when the forward current flows on the first surface of the insulating substrate, the reverse current flows on the second surface of the insulating substrate.

2. A method for manufacturing a printed wiring board according to claim 1, wherein the applying of the pulse plating includes flowing the forward current and the reverse current on the first surface of the insulating substrate and flowing the forward current and the reverse current on the second surface of the insulating substrate such that when the forward current flows on the second surface of the insulating substrate, the reverse current flows on the first surface of the insulating substrate.

3. A method for manufacturing a printed wiring board according to claim 1, wherein the pulse plating has a periodic current waveform such that the forward and reverse currents on the first surface of the insulating substrate and the forward and reverse currents on the second surface of the insulating substrate have a same periodic current waveform, and the pulse plating is applied such that a phase difference is formed between a periodic current waveform of the forward and reverse currents on the first surface of the insulating substrate and a periodic current waveform of the forward and reverse currents on the second surface of the insulating substrate.

4. A method for manufacturing a printed wiring board according to claim 1, further comprising:
    applying DC plating prior to the applying of the pulse plating.

5. A method for manufacturing a printed wiring board according to claim 4, wherein the DC plating is applied such that the DC plating has a current density which is less than current densities of the forward currents on the first and second surfaces of the insulating substrate.

6. A method for manufacturing a printed wiring board according to claim 2, further comprising:
    applying DC plating prior to the applying of the pulse plating.

7. A method for manufacturing a printed wiring board according to claim 6, wherein the DC plating is applied such that the DC plating has a current density which is less than current densities of the forward currents on the first and second surfaces of the insulating substrate.

8. A method for manufacturing a printed wiring board according to claim 3, further comprising:
    applying DC plating prior to the applying of the pulse plating.

9. A method for manufacturing a printed wiring board according to claim 8, wherein the DC plating is applied such that the DC plating has a current density which is less than current densities of the forward currents on the first and second surfaces of the insulating substrate.

10. A method for manufacturing a printed wiring board according to claim 2, wherein the pulse plating has a periodic current waveform such that the forward and reverse currents on the first surface of the insulating substrate and the forward and reverse currents on the second surface of the insulating substrate have a same periodic current waveform, and the pulse plating is applied such that a phase difference is formed between a periodic current waveform of the forward and reverse currents on the first surface of the insulating substrate and a periodic current waveform of the forward and reverse currents on the second surface of the insulating substrate.

11. A method for manufacturing a printed wiring board according to claim 10, further comprising:
applying DC plating prior to the applying of the pulse plating.

12. A method for manufacturing a printed wiring board according to claim 11, wherein the DC plating is applied such that the DC plating has a current density which is less than current densities of the forward currents on the first and second surfaces of the insulating substrate.

13. A method for manufacturing a printed wiring board according to claim 1, wherein the forming of the through hole comprises irradiating laser upon the first surface of the insulating substrate and irradiating laser upon the second surface of the insulating substrate such that the through hole has an hourglass form.

14. A method for manufacturing a printed wiring board according to claim 13, wherein the applying of the pulse plating includes flowing the forward current and the reverse current on the first surface of the insulating substrate and flowing the forward current and the reverse current on the second surface of the insulating substrate such that when the forward current flows on the second surface of the insulating substrate, the reverse current flows on the first surface of the insulating substrate.

15. A method for manufacturing a printed wiring board according to claim 13, wherein the pulse plating has a periodic current waveform such that the forward and reverse currents on the first surface of the insulating substrate and the forward and reverse currents on the second surface of the insulating substrate have a same periodic current waveform, and the pulse plating is applied such that a phase difference is formed between a periodic current waveform of the forward and reverse currents on the first surface of the insulating substrate and a periodic current waveform of the forward and reverse currents on the second surface of the insulating substrate.

16. A method for manufacturing a printed wiring board according to claim 13, further comprising:
applying DC plating prior to the applying of the pulse plating.

17. A method for manufacturing a printed wiring board according to claim 16, wherein the DC plating is applied such that the DC plating has a current density which is less than current densities of the forward currents on the first and second surfaces of the insulating substrate.

18. A method for manufacturing a printed wiring board according to claim 14, further comprising:
applying DC plating prior to the applying of the pulse plating.

19. A method for manufacturing a printed wiring board according to claim 18, wherein the DC plating is applied such that the DC plating has a current density which is less than current densities of the forward currents on the first and second surfaces of the insulating substrate.

20. A method for manufacturing a printed wiring board according to claim 14, wherein the pulse plating has a periodic current waveform such that the forward and reverse currents on the first surface of the insulating substrate and the forward and reverse currents on the second surface of the insulating substrate have a same periodic current waveform, and the pulse plating is applied such that a phase difference is formed between a periodic current waveform of the forward and reverse currents on the first surface of the insulating substrate and a periodic current waveform of the forward and reverse currents on the second surface of the insulating substrate.

* * * * *